(12) United States Patent
Phillips

(10) Patent No.: US 7,471,443 B2
(45) Date of Patent: Dec. 30, 2008

(54) PIEZOELECTRIC FLEXURES FOR LIGHT MODULATOR

(75) Inventor: Andrew Phillips, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 393 days.

(21) Appl. No.: 10/792,528

(22) Filed: Mar. 2, 2004

(65) Prior Publication Data
US 2005/0195408 A1    Sep. 8, 2005

(51) Int. Cl.
G02B 26/00 (2006.01)

(52) U.S. Cl. ............. 359/291; 359/290; 359/223; 359/224

(58) Field of Classification Search ............ 359/223, 359/224, 290, 291, 292, 296, 238; 345/105, 345/107; 430/32, 34, 38
See application file for complete search history.

(56) References Cited

U.S. PATENT DOCUMENTS

| 5,589,084 | A | | 12/1996 | Ji et al. |
|---|---|---|---|---|
| 5,959,777 | A | * | 9/1999 | Whitehead ............... 359/618 |
| 6,078,473 | A | | 6/2000 | Crane et al. |
| 6,108,175 | A | | 8/2000 | Hawwa et al. |
| 6,204,925 | B1 | | 3/2001 | Prikryl et al. |
| 6,297,577 | B1 | * | 10/2001 | Hotomi et al. ............ 310/330 |
| 6,351,354 | B1 | | 2/2002 | Bonin |
| 6,445,488 | B1 | * | 9/2002 | Lee ......................... 359/291 |
| 6,455,931 | B1 | | 9/2002 | Hamilton, Jr. et al. |
| 6,594,059 | B2 | * | 7/2003 | Flanders .................. 359/230 |
| 6,885,493 | B2 | * | 4/2005 | Ljungblad et al. ........ 359/290 |
| 2001/0013575 | A1 | | 8/2001 | Cleveland et al. |
| 2002/0153480 | A1 | | 10/2002 | Cleveland et al. |
| 2003/0041669 | A1 | * | 3/2003 | Degertekin et al. ......... 73/651 |
| 2003/0197446 | A1 | | 10/2003 | Ives |
| 2004/0017620 | A1 | * | 1/2004 | Kaneko et al. ............ 359/824 |
| 2004/0070315 | A1 | * | 4/2004 | Takeuchi et al. .......... 310/334 |
| 2004/0114210 | A1 | * | 6/2004 | Fitzpatrick et al. ........ 359/291 |
| 2004/0150939 | A1 | * | 8/2004 | Huff ........................ 361/277 |
| 2006/0006763 | A1 | * | 1/2006 | Takeuchi et al. .......... 310/328 |
| 2006/0082863 | A1 | * | 4/2006 | Piehl et al. ............... 359/291 |

FOREIGN PATENT DOCUMENTS

EP            281772      *  9/1988

* cited by examiner

Primary Examiner—Timothy J Thompson

(57) ABSTRACT

A device includes a micro-display that includes at least one light modulator. The light modulator includes a first reflector plate, a second reflector plate, and at least one piezoelectric flexure, wherein the piezoelectric flexure is an extended length piezoelectric flexure.

25 Claims, 4 Drawing Sheets

PIEZOELECTRIC FLEXURES FOR LIGHT MODULATOR

BACKGROUND

The invention generally pertains to light modulators, and specifically to piezoelectric flexures for light modulation of such displays as micro-displays and projectors. Certain conventional optical micro-displays, such as those that include Fabry-Perot interference devices, use two reflector plates that are spaced within a micro-display window to form an interference pattern there between. At least one reflector plate within the micro-display window is adjustable using one or more piezoelectric flexures to alter the interference pattern, and thereby alter the color of light that is projected. Recent micro-display modulator designs require considerable displacement of one or more of the flexures, often for a distance that is greater than that provided by many designs of piezoelectric flexures. As the length of the pixel plate decreases, it is challenging to design and construct flexures that are configured to allow for the deflection.

It would therefore be desirable to increase the distance over which the flexures can be deflected, especially in flexures that operate to displace small pixel plates as found in micro-display modulators.

BRIEF DESCRIPTION OF THE DRAWINGS

Illustrative and presently preferred embodiments of the invention are shown in the drawings, in which.

The same numbers are used throughout the document to reference like components and/or features.

DETAILED DESCRIPTION

This disclosure describes a variety of piezoelectric flexures that can be applied to optical micro-displays to improve the range of wavelengths and performance of that optical micro-display. This disclosure describes a number of embodiments of piezoelectric flexures that provide improved displacement. Within this disclosure, the term "optical micro-display" applies to any display or projection device including, but not limited to: computer micro-displays, projectors, and monitors; television micro-displays, projectors, and monitors; back-lit projectors, micro-displays, and monitors; personal projection systems such as heads-up displays and portable projection systems; and front-lit projectors, micro-displays, and monitors.

Optical Micro-Displays

Figure 1:
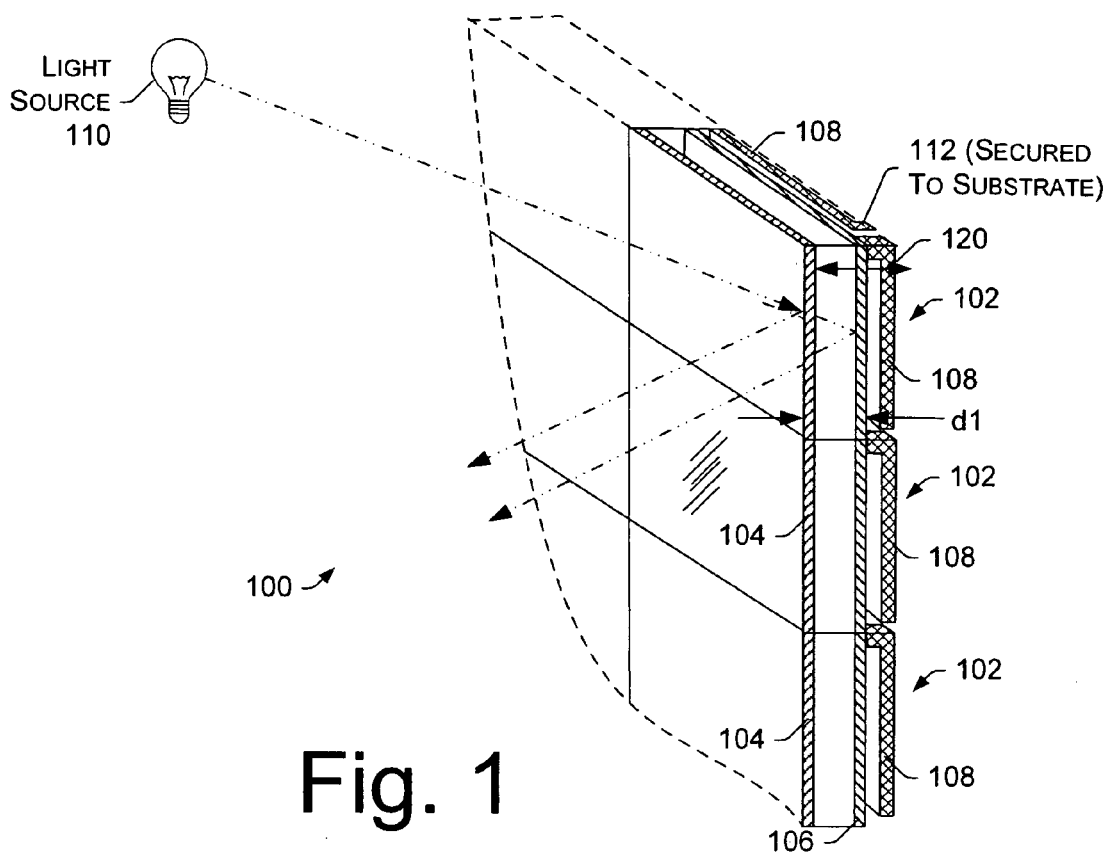
FIG. 1 is a schematic diagram of one embodiment of an optical micro-display of the present invention that is formed using multiple micro-display modulators.

FIG. 1 shows one embodiment of the optical micro-display 100 that includes a plurality of micro-display modulators 102 that are formed in an array or other configuration, and a light source 110. Each micro-display modulator 102 includes a front reflector plate 104, a rear reflector plate 106, and a piezoelectric flexure 108. The piezoelectric flexure 108 is attached at one end to one of the reflector plates 104, 106, and at another end by a substrate anchor 112 to a substrate (not shown). The piezoelectric flexure 108 can be actuated to alter the spacing between the substrate and the reflector plate 104, 106.

In this disclosure, the terms "front" and "back" when relating to the reflector plates 104 and 106 and the associated piezoelectric flexures correspond to the order that light from the light source initially encounters the reflector plates and not to any actual physical position of the optical micro-display. The optical micro-display 100 of FIG. 1 is a front-projection micro-display in which light is applied from the light source 110 through the micro-display modulators 102 forming the optical micro-display 100 to the front reflector plate 104 of each micro-display modulator 102. In one embodiment, the front reflector plate 104 is a partially reflective mirror in which some percentage of light, e.g., 10-90 percent, is reflected. The remainder of the light is transmitted towards the rear reflector plate 106. The rear reflector plate 106 is fully reflective in that it reflects substantially all of the light that impinges on its surface.

In one embodiment, the micro-display modulator 102 may be configured as a Fabry-Perot optical interference device. Conventional Fabry-Perot devices are commercially available and their operation is well understood. The front reflector plate 104 and the rear reflector plate 106 are spaced by a prescribed separation distance d1. This separation distance d1 is varied in many embodiments by a piezoelectric flexure 108 moving as shown by the arrows 120 to displace the rear reflector plate 106, and thereby vary the wavelength of light that is reflected based on interference principles as described herein.

The distance d1 measures the distance between the reflector plates 104, 106, and the distance determines the phase of the light reflected off the rear reflector plate 106 with respect to the phase of the light reflected off the front reflector plate 104. The light that reflects off the rear reflector plate 106 travels a greater controllable distance than the light that reflects off the front reflector plate 104. This greater controllable distance is some multiple of a cosine function of the separation distance d1; the cosine function represents the angle from the perpendicular of the reflector plates that the light is traveling. The separation distance d1 thereby determines which wavelengths of light are constructively or destructively modulated within the micro-display modulator 102. Reflected beams of light from the reflector plates 104, 106 whose wavelengths are in phase with respect to each other will be reflected/projected by the micro-display. Reflected beams of light from the reflector plates 104, 106 whose wavelengths are out of phase with respect to each other will not be reflected/projected by the micro-display.

While the micro-display modulator 102 as described with respect to FIG. 1 is a relatively specific type of light modulator such as a Fabry-Perot type device, it is to be understood that a wide variety of light modulators that can modulate light based on wavelength, and thereby display a specific color, are also within the scope of the disclosure.

In one embodiment, the light that is applied from the light source 110 is a white light. In all embodiments, the light source at least provides a range of wavelengths of light in the visible or invisible light spectrum that can be emitted by each one of the micro-display modulators 102 of the optical micro-display 100.

The micro-display modulator 102 of FIG. 1 thereby acts to provide variable color, or intensity of color, at one micro-display modulator 102 of the optical micro-display 100. Each optical micro-display 100 contains a large number of micro-display modulators 102 that are typically contained in an array configuration. In one embodiment of the optical micro-display 100, each micro-display modulator 102 is modulated to any desired color based on the control of the separation distance d1. In another embodiment, groups of micro-display modulators can be included in a particular display modulator 102 in which each micro-display modulator can be constrained to display specific colors, e.g., primary colors such as red, green, and blue.

Figure 3:
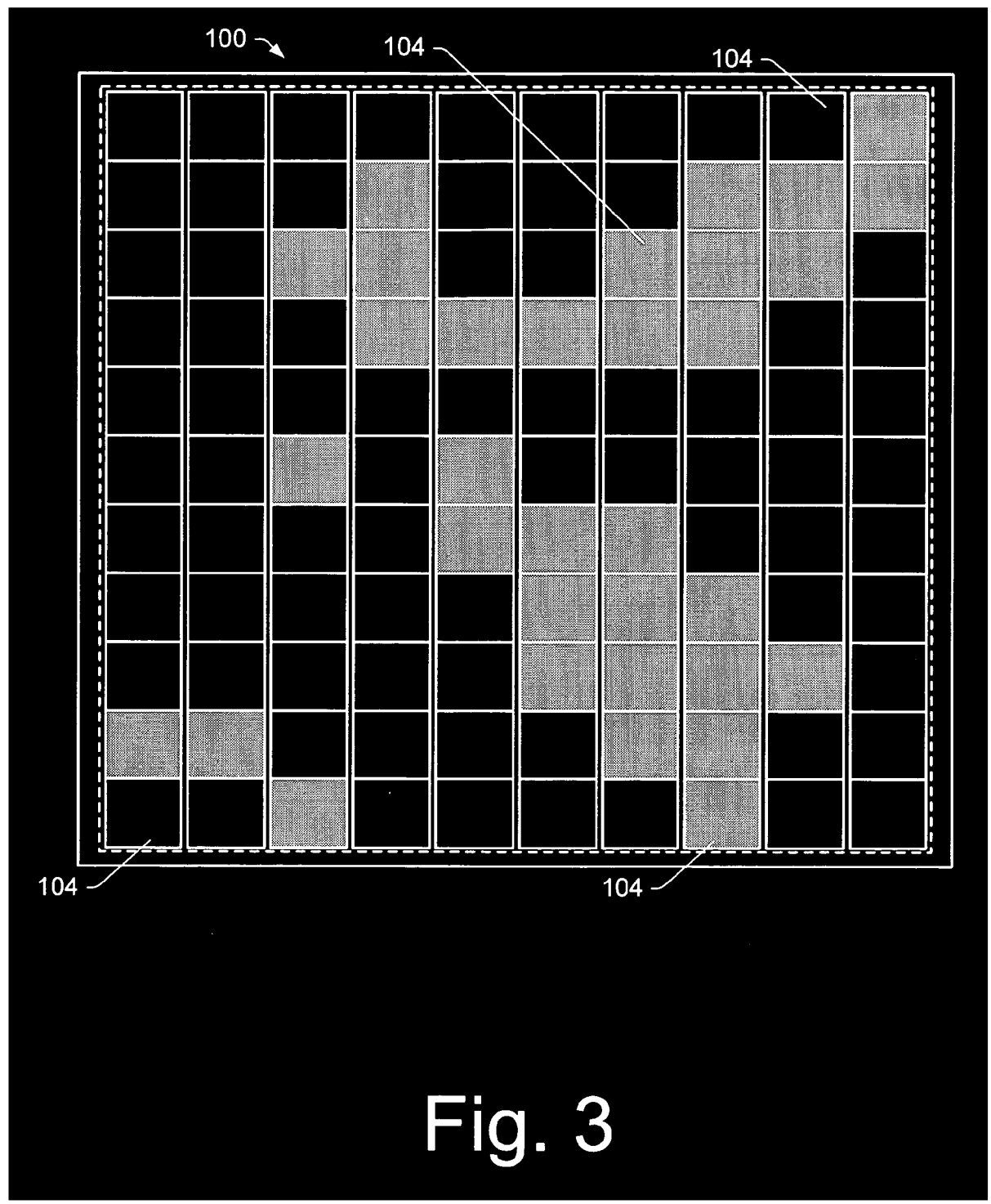
FIG. 3 shows a front view of one embodiment of the optical micro-display formed from a plurality of display windows as shown in FIG. 1.

Pixellated micro-display formats represent one embodiment in which each micro-display modulator 102 is formed from a group of sub-micro-display modulators. Each sub-micro-display modulator contributes one color, such as a primary color, such that the combined intensities of the different colors from the distinct sub-micro-display modulators within the group determines the overall color projected by the group at that region. Within this disclosure, each sub-micro-display modulator is considered to be structured as, and to operate as, a distinct micro-display modulator 102. Conventional pixellated micro-display formats and projection micro-displays are commercially available, and will not be further described in this disclosure. FIG. 3 shows the front view of one embodiment of an optical micro-display 100 formed from a plurality of micro-display modulators 102, such as using micro-display windows, whose colors can be individually varied by displacement of at least one reflector plate 104, 106 as shown in FIG. 1 as a result of displacement of the piezoelectric flexure 108.

This disclosure provides a number of aspects of piezoelectric flexures 108 that provide for increased relative displacement of the reflector plates 104 and 106 while still allowing very precise adjustment down to the nanoscale as applied to small micro-display modulators 102. Two embodiments of piezoelectric flexures that are described include dual active layer piezoelectric flexures as described with respect to FIG. 2, and an extended length piezoelectric flexure as described with respect to FIGS. 4, 5, and 6. The dual active layer piezoelectric flexures and the extended length piezoelectric flexure can be used either separately or in combination with each other. The combination of the dual active layer piezoelectric flexure with an extended length piezoelectric flexure provides for even further increased deflection.

Considering that the dimensions of the micro-display modulators are decreasing, e.g., current conventional reflector plates have a cross-sectional dimension down to less than 20 μm, the corresponding dimension of many types of the associated piezoelectric flexure also have to decrease to maintain the piezoelectric flexure within the lateral outlines of each corresponding micro-display modulator. By maintaining the piezoelectric flexures within the area outlined by the reflective plates, the displacement of each piezoelectric flexure does not interfere with the piezoelectric flexures of adjacent micro-display modulators, and the lengths of the arms of the piezoelectric flexures also decrease.

This disclosure provides several mechanisms to increase the out-of-plane deflection of the piezoelectric flexures upon the reflector plates.

Dual Active Layer Piezoelectric Flexures

To modulate the light projected from within the micro-display modulator 102, in order to modify the distance d1: either the front reflector plate 104 is displaced with respect to the rear reflector plate 106 or the rear reflector plate 106 is displaced with respect to the front reflector plate 104. The piezoelectric flexure 108 that is shown attached to the rear reflector plate 106 in FIG. 1, but could also be attached to the front reflector plate 104, acts to provide this displacement of at least one of the reflector plates 104, 106.

Figure 2:
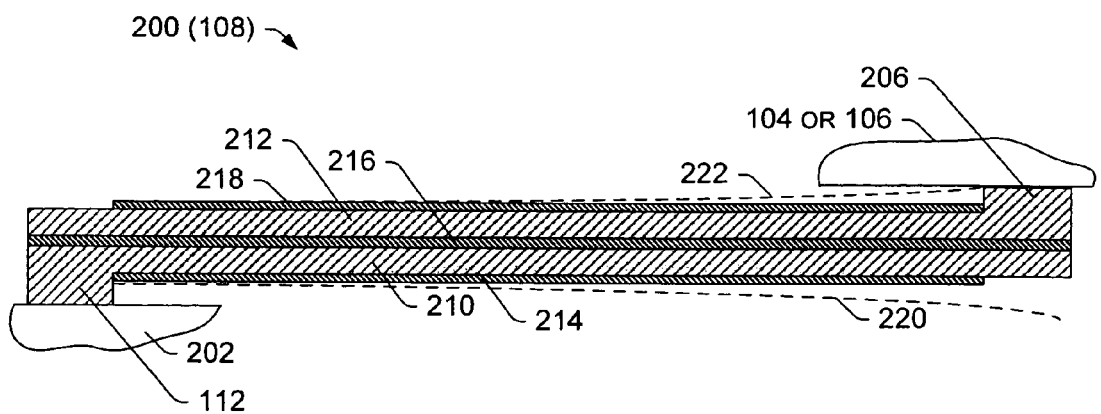
FIG. 2 shows a cross-sectional view of one embodiment of a dual active layer piezoelectric flexure of the present invention such as would be included in one of the micro display modulators of FIG. 1.

FIG. 2 shows one embodiment of a piezoelectric flexure 108 in its respective neutral position as solid, in its exaggerated deflected upward position at dotted line 222, and in its exaggerated deflected downward position at dotted line 220. The piezoelectric flexure 108 is arranged as a dual active layer piezoelectric flexure 200. The dual active layer piezoelectric flexure 200 is secured to a substrate 202 at a substrate anchor 112, and secures one of the reflector plates 104, 106 at the reflector plate anchor 206. The dual active layer piezoelectric flexure 200 includes two piezoelectric actuator layers 210 and 212, and three electrode layers 214, 216, and 218. As shown with respect to FIG. 2, the electrode layer 214 is below the piezoelectric actuator layer 210. The electrode layer 216 is intermediate the two piezoelectric actuator layers 210 and 212. The electrode layer 218 is above the piezoelectric actuator layer 212.

During deflection of the dual active layer piezoelectric flexure 200, the upper electrode layer 218 and the lower electrode layer 214 are biased with the same polarity; while the intermediate electrode layer 216 is biased differentially with respect to the other electrode layers 214 and 218. As such, opposite electric fields are applied across the different piezoelectric actuator layers 210 and 212, which will result in one piezoelectric actuator layer expanding along a length of the piezoelectric flexure while the other one is contracting along an identical length.

For example, if the electric field that is applied to the piezoelectric actuator layer 210 results in the layer contracting, the opposite field applied across the layer 212 will result in the layer expanding, assuming that both layers have a common poling direction. The resultant deformation of the dual active layer piezoelectric flexure 200 will be a downward deflection indicated by the dotted line 220. Conversely, if the electric field that is applied to the piezoelectric actuator layer 210 results in the layer expanding, the opposite field applied across the layer 212 will result in the layer contracting, assuming that both layers have a common poling direction. The resultant deformation of the dual active layer piezoelectric flexure 200 will be an upward deflection indicated by the dotted line 222.

In one embodiment, the dual active layer piezoelectric flexure 200 displaces the rear reflector plate 106 as shown in FIG. 1; although in other embodiments, the dual active layer piezoelectric flexure can also be used to displace the front reflector plate 104. The three electrode layers 214, 216, and 218 thereby allow for relative biasing of the piezoelectric actuator layers 210 and 212 to provide bending of the dual active layer piezoelectric flexure 200.

Certain single layer embodiments of the piezoelectric flexures, not shown, connect a single rigid electrode layer to a single piezoelectric layer. As such, the single active piezoelectric layer acts against the single non-active electrode layer to cause the deflection. By comparison, in the dual active layer piezoelectric flexure 200 of the present disclosure, one expanding piezoelectric actuator layer 210 or 212 biases against the opposed actuator layer. Using these opposed contracting/expanding piezoelectric actuator layers 210 and 212 provides greater deflections for a device than conventional single actuator layer piezoelectric flexures of similar configurations and dimensions. The dual active layer piezoelectric flexure 200, including the two counter-biased piezoelectric actuator layers 210 and 212, provide more curvature for a particular biasing due to the intermediate electrode biasing. This configuration of the counter-biased piezoelectric actuator layers 210 and 212 effectively doubles the electric field across the dual active layer piezoelectric flexure 200.

The dual active layer piezoelectric flexure 200 including the piezoelectric actuator layers 210 and 212 provides precise positioning down to and including the sub-nanometer range. Dual piezoelectric actuator layers can provide precise and relatively large displacements in response to voltage variations. Furthermore, the displacement response of the piezoelectric flexure with respect to applied voltage is almost linear since the piezoelectric flexure is deflecting laterally in the axial direction over a considerable length. Additionally, the displacement of the piezoelectric flexure is not susceptible to the "snap down" phenomenon that occurs with conventional electrostatically actuated modulators in which the electrostatic deflecting force (which is a proportional to the distance squared) overwhelms the mechanical restoring force (which is approximately linear with respect to the deflection distance). The motion for piezoelectric actuator layer devices such as the dual active layer piezoelectric flexure 200 is not influenced by stiction or friction such as occurs with many conventional electrostatic actuators.

The dual active layer piezoelectric flexure 200 as described with respect to FIG. 2 thereby provides a mechanism to increase the deflection of the reflector plates. This increase in deflection of the piezoelectric flexures for the dual active layer piezoelectric flexure can be provided by itself, or in combination with other mechanisms to increase the deflection to the extended length piezoelectric flexures as described in this disclosure, but not limited to that exact configuration.

The dual active layer piezoelectric flexure 200 can be biased in any suitable manner to provide a desired deflection. For instance, depending upon the configuration of the dual active layer piezoelectric flexure 200 and the reflector plates 104 or 106, the deflection from the neutral state to the raised state as indicated by curved line 222 may be sufficient to provide the necessary deflection to the reflector plate such that the range of colors may be provided by the light modulator 102 of FIG. 1. In another embodiment, the deflection between the lower deflected state as indicted by the curved line 220 and the upper deflected state as indicated by the curved line 222 may be necessary to provide the range of colors to the light modulator.

Extended Length Piezoelectric Flexures

This disclosure provides a number of mechanisms by which the piezoelectric flexure provides an increased deflection to at least one of the reflector plates 104, 106 relative to the substrate as shown in FIG. 1. In the aspect described with respect to FIG. 2, the dual active layer piezoelectric flexure 200 is configured to provide an increased deflection as a result of providing a dual active layer piezoelectric flexure 200 that has a greater length with respect to the reflector plate 104.

The cross-sectional dimensions of conventional reflector plates within micro-display modulators have been decreasing to increase the resolution, and improve the image of the optical display 100. Consider that the cross-sectional dimensions have planar dimensions of less than 50 micrometers (μm), such as 10-20 μm in a diagonal direction. While this disclosure describes an optical display, it is envisioned that the flexure concepts as described herein can be applied to optical switches, non-Fabry-Perot light modulators, and any other mechanism in which a flexure is used to displace one reflector plate to modulate light. In certain embodiments such as optical switches, the 50 nm diagonal dimension can be exceeded. Another factor driving micro-displays to smaller geometries is that of manufacturing ability and cost, especially where the light modulator is integrated within a silicon integrated circuit (IC). As such, piezoelectric flexures for conventional reflector plates have to be configured to provide sufficient displacement to the reflector plates within these limited dimensions. It has proven challenging to provide such deflection with conventional piezoelectric flexures within the limited dimensions of each display modulator 102 in the optical display 100.

Figure 4:
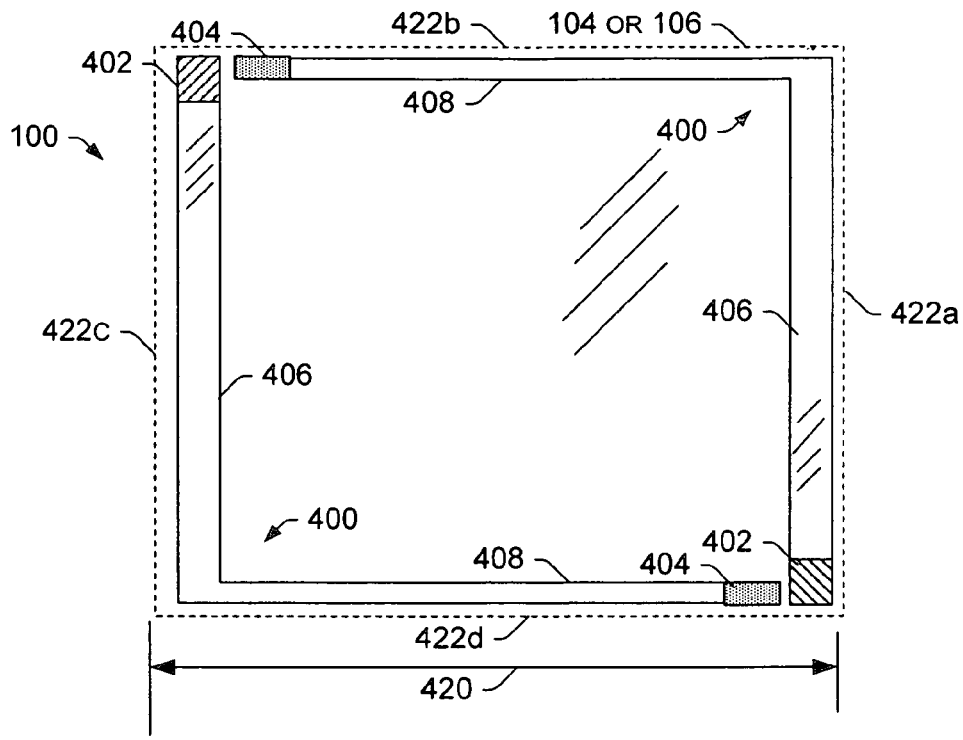
FIG. 4 shows a cross-sectional view of one embodiment of an L-shaped extended length piezoelectric flexure of the present invention.

FIG. 4 shows one embodiment of an extended length piezoelectric flexure 400 that is shown as a dual active layer piezoelectric flexure 200, but can be configured as another embodiment of piezoelectric flexure. The embodiment of an extended length piezoelectric flexure 400 of FIG. 4 is configured to provide an increased deflection that provides an increased deflection to one of the reflector plates 104 or 106 (shown in phantom) as shown in FIG. 1. The extended length piezoelectric flexure 400 includes a substrate mount 402 that is affixed to the substrate of the micro-display modulator 102, a reflector plate mount 404 that is affixed to the reflector plate 104 or 106 that the extended length piezoelectric flexure 400 displaces; and extended length arms 406 and 408 that provide the displacement of the extended length piezoelectric flexure 400.

The material and/or the dimensions of the extended length arm 406 can be selected to provide the desired flex characteristics. The portion of the extended length piezoelectric flexure 400 that forms the substrate mount 402 does not deflect as a result of its attachment to the substrate. The portion of the extended length piezoelectric flexure 400 that does not form the substrate mount 402 deflects in response to the stress that is applied to and/or the strain that exists in the piezoelectric actuator layers 210, 212. The greater the distance along the extended length arms 406 and 408 that is allowed to deflect, the greater the deflection from its unstressed state for a given applied voltage.

Within this disclosure, the term "extended length" as applied to the extended length piezoelectric flexure 400 indicates that its active length 410 that equals the length of the arm 406 added to the arm 408, is greater than the cross-sectional dimension of the reflector plate 104 or 106 that is being displaced as shown as 420 in FIG. 4. A variety of configurations, e.g., embodiments, provide for the extended length piezoelectric flexure 400 include the L-shaped extended length piezoelectric flexure 422 as described with respect to FIG. 4, a curved extended length piezoelectric flexure 500 as described with respect to FIG. 5, and a dropped extended length piezoelectric flexure 600 as described with respect to FIG. 6.

FIG. 4 shows one embodiment of the L-shaped extended length piezoelectric flexure 400 including the substrate mount 402, the reflector plate mount 404, a first arm 406, and an orthogonal second arm 408. The first arm 406 and the orthogonal second arm 408 are secured to each other at approximately ninety degrees (e.g., slight deviations from the ninety degree angle are within the intended scope of the present disclosure). Since the first arm 406 and the second orthogonal arm 408 can each be configured as a dual active layer piezoelectric flexure 200, the length of the first arm and the second orthogonal arm can each contribute considerable deflection to the reflector plate 104 or 106.

In one embodiment, each reflector plate 104, 106 is actuated by two L-shaped extended length piezoelectric flexures 400 that are substantially opposed to each other about the periphery of the reflector plate 104 or 106. For instance, assume that the reflector plate 104, 106 is provided with four adjacent sides 422a, 422b, 422c, and 422d. One L-shaped extended length piezoelectric flexure 400 can extend proximate to sides 422a and 422b. A second L-shaped extended length piezoelectric flexure 400 can extend proximate to sides 422c and 422d. These two L-shaped extended length piezoelectric flexures 400 provide the support and displacement for the respective reflector plate 104 or 106. The reflector plate mount 404 of one L-shaped extended length piezoelectric flexure 400 is opposed to the reflector plate mount 404 of another L-shaped extended length piezoelectric flexure.

As such, deflection to the reflector plate 104 or 106 is provided by two L-shaped extended length piezoelectric flexures at their reflector plate mounts that are located at diametrically opposed locations across the reflector plate. In this manner, the reflector plate is adequately supported through the deflections, and the reflector plate is uniformly deflected. Such deflection to the reflector plate is virtually linear considering the extended length of the arms of the L-shaped extended length piezoelectric flexures that can be deflected. In different embodiments of the micro-display modulator 102, the piezoelectric flexures are mounted at opposed locations for these reasons. The other embodiments of this disclosure also provide opposed piezoelectric flexure reflector plate mounts, but for simplicity of description, the operation of only one micro-display modulator is described.

Another factor is that if the arm 408 has a relatively narrow cross-sectional area (either a necked-down portion of it or along its entirety), it will allow twisting around the axial length. This twisting of the arm allows the reflector plate mount 404 to remain vertical, even though the connection between arms 406 and 408 provides some twisting. Maintaining the reflector plate mount 404 vertical reduces the stress and strain applied to the reflector plate.

The L-shape extended length piezoelectric flexures 400 allows the flexure to be complaint, e.g., less rigid, in both axes of the plane parallel to the reflector plate. By comparison, a conventional straight piezoelectric flexure would be compliant along the lateral (bending) axis of the flexure, but relatively non-compliant along the longitudinal axis that extends along the length of the flexure. Thus many embodiments of a non-straight flexure, such as the L-shaped extended length piezoelectric flexures 400, provide compliancy (thereby allowing springiness) along both axes of the plane of the reflector plate, and thus partially compensate for changes in the relative distance between the reflector mounts 404 due to effective horizontal shortening of the flexures as a result of the vertical bending. Narrowing of the flexure near the reflector mount also facilitates twisting of the flexure in the long axis, thus allowing the reflector plate mount to remain vertical through vertical deflections of the reflector plate.

Having all of the L-shaped extended length piezoelectric flexures 400 laterally constrained within the periphery of the four adjacent sides 422a, 422b, 422c, and 422d also reduces the possibility that the operation of one L-shaped extended length piezoelectric flexure 400 would interfere with the operation of any adjacent reflector plate within the micro-display modulator 102.

The L-shaped extended length piezoelectric flexure 400 provides one mechanism by which a piezoelectric flexure has a greater active length than the dimension of one side of the reflector plate 104; and can therefore be used to increase the deflection distance of the reflector plate.

Figure 5:
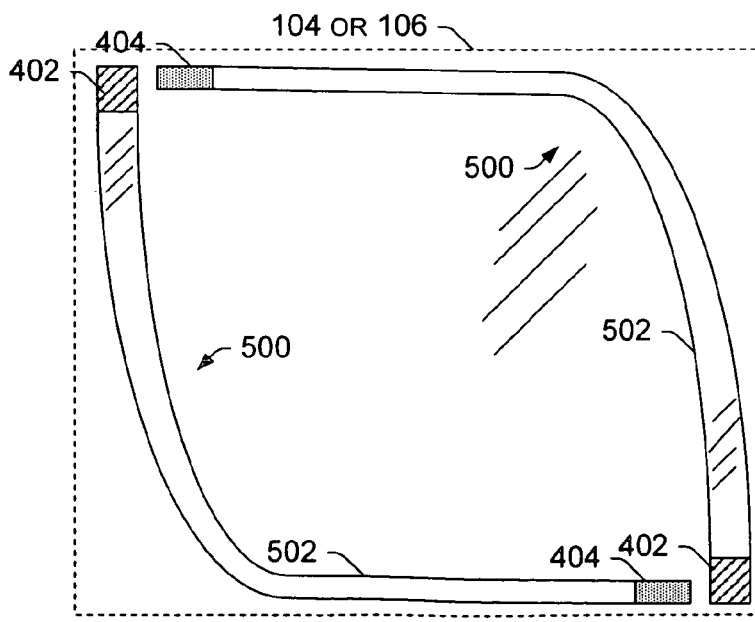
FIG. 5 shows a cross-sectional view of one embodiment of a curved extended length piezoelectric flexure of the present invention.

Any other configuration that has a greater active length than the dimension of one side of the reflector plate, and can be applied to deflect the reflector plate is within the intended scope of the present disclosure. For instance, FIG. 5 shows another embodiment of the extended length piezoelectric flexure 400 as shown in FIG. 4 that is configured as a curved extended length piezoelectric flexure 500. The curved extended length piezoelectric flexure 500 contains a curved actuator arm 502 instead of the first arm 406 and the second orthogonal arm 408 as described with respect to the L-shaped extended length piezoelectric flexures 400. The entire curved actuator arm 502 can be configured as a dual active layer piezoelectric flexure 200 as described with respect to FIG. 2 which can provide an increased deflection, or alternately as some other type of piezoelectric flexure.

The curved extended length piezoelectric flexure 500 allows for deflection along its entire length of the curved actuator arm 502 from adjacent to the substrate mount 402 to the reflector plate mount 404. As such, an active deflectable length of the curved actuator arm 502 as measured in the curved direction exceeds the dimension of the deflected reflector plate 104 or 106. It is envisioned that slightly different embodiments of the extended length piezoelectric flexure 400 can be provided considering the concepts discussed with respect to FIGS. 4 and 5. For example, slight curves and angles can be applied to the curved actuator arm while remaining within the scope of the present disclosure.

One aspect of the embodiments of the extended length piezoelectric flexures 400 as described with respect to FIGS. 4 and 5 is that they undergo some horizontal shortening when they are deflected in a vertical direction. This is due to the fact that the effective horizontal dimension of the piezoelectric flexures decreases as the piezoelectric flexures curve upwardly or downwardly. The L-shaped or curved configuration of the embodiments of the extended length piezoelectric flexures 400 provide for some springiness along both axes that are parallel to the plane of the reflector plate. By using the L-shaped or curved flexures, the piezoelectric flexure provides a more linear actuation to the reflector plate 104 or 106 than do straight piezoelectric flexures. In this disclosure, the term "actuation" relates to the deflection as a function of applied voltage. With this relatively linear actuation through a considerable deflection range, a predictable amount of force is used to deflect the reflector plate in response to an applied voltage/electric field.

Figure 6:
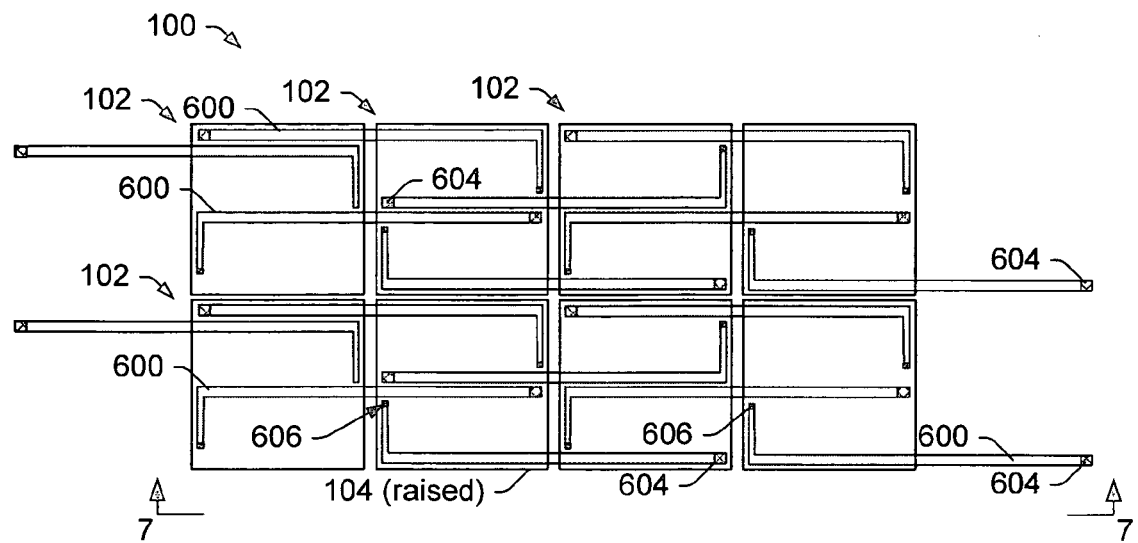
FIG. 6 shows a front view of one embodiment of a dropped extended length piezoelectric flexure of the present invention.
Figure 7:
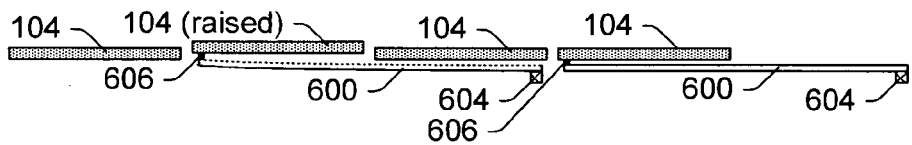
FIG. 7 shows a cross-sectional view of the dropped extended length piezoelectric flexure of FIG. 6 as taken through sectional lines 7-7 in FIG. 6.

Another embodiment of extended length piezoelectric flexure 400 (e.g., a dropped extended length piezoelectric flexure 600) is described with respect to FIGS. 6 and 7. In this embodiment, each dropped extended length piezoelectric flexure 600 extends outside of the lateral boundaries of the micro-display modulators 102, e.g., the deflected reflector plate 104. Since the extended length piezoelectric flexure does extend outside the dimensions of the reflector plate 104, 106, each extended length piezoelectric flexure is configured so that it does not contact any adjacent reflector plate. FIG. 6 shows a regular pattern of the dropped extended length piezoelectric flexure 600 that repeats itself each two micro-display modulators 102 in each axial direction. Instead of the extended length piezoelectric flexure being made of two legs 406 and 408 that each extend for a distance less than the dimension of the micro-display modulators 102 as shown in FIG. 4, the present disclosure provides a mechanism by which one leg of the L-shaped pattern of the extended length piezoelectric flexure 600 extends for nearly the length of two micro-display modulators 102. In this manner, the length of the dropped extended length piezoelectric flexure 600 that can be deflected is further increased. Because the out of plane deflection of the piezoelectric flexure is curved, the vertical deflection is a non-linear function of the flexure length. As a result, any additional length afforded by the dropped extended length piezoelectric flexure, or any mechanism that increases the effective deformable length of the flexure, allows a significant increase in the vertical deflection as compared to a flexure restricted to the confines of a single pixel plate.

The dropped extended length piezoelectric flexure 600 allows for one of the reflecting plates 104 to be vertically displaced without the dropped extended length piezoelectric flexure physically contacting another reflecting plate. This lack of contact between the dropped extended length piezoelectric flexure 600 and the neighboring reflecting plates during a full range of motion is accomplished by lowering, or dropping, those portions of the dropped extended length piezoelectric flexure 600 that may contact the reflector plate, other piezoelectric flexures, or other associated structures.

To accomplish this clearance, a substrate clearance arm 604 is provided at the substrate mount 602, and a reflector plate clearance arm 606 is provided at the reflector plate mount 604. As a result of the clearance mounts 604 and 606, the dropped extended length piezoelectric flexure 600 is spaced a sufficient distance from the reflector plates to reduce any contact with any of the reflector plates or other piezoelectric flexures during actual displacement. In another embodiment of the present disclosure, the dropped extended length piezoelectric flexures 600 for adjacent reflector plates can be separated from each other in a direction parallel to the plane of the reflector plate. Any configuration of dropped extended length piezoelectric flexure 600 that reduces the possibility of contacting other reflector plates and/or other piezoelectric flexures is within the intended scope of the present disclosure.

Even for the dropped extended length piezoelectric flexures 600 as described with respect to FIG. 6, the L shape of the flexure is highly desirable, so that the flexures can compensate for the "effective shortening", as they bend.

The different embodiments of the extended length piezoelectric flexures as described within this disclosure can be fabricated using micro electromechanical (MEMs) processing techniques. For instance, the voids between the piezoelectric flexures and the substrate can be fabricated using sacrificial etching layers deposited on the substrate. The pattern of the piezoelectric flexures can be fabricated using conventional thinfilm photolithography and etching techniques. The voids between the piezoelectric flexures and the reflector plate that the flexure is displacing can be formed using a sacrificial etching layer to support the reflector plate during patterning and then removing the sacrificial layer to "release" the plate In one embodiment, the mounts (e.g., 604 and 606 in FIGS. 6 and 7) can be fabricated as metal posts deposited into vias and then exposed during the removal of the sacrificial material. These MEMs manufacturing techniques of the piezoelectric flexures are intended to be illustrative in nature, but not limiting in scope since other techniques and processes can be used.

This disclosure thereby can provide an increased deflection to piezoelectric flexures that are applied to reflector plates of micro-display modulators. Considering the decreasing size of many micro-display modulators, piezoelectric flexures that can provide for an increased deflection are especially desirable in making many micro-display modulators operational. Having herein set forth preferred embodiments of the present invention, it is anticipated that suitable modifications can be made thereto which will nonetheless remain within the scope of the present invention.

What is claimed is:
1. An apparatus, comprising:
 a micro-display including a light modulator, the light modulator further comprising a first reflector plate, a second reflector plate, and at least one piezoelectric flexure, wherein the piezoelectric flexure is an extended length piezoelectric flexure, and wherein the extended length piezoelectric flexure is configured as a dual active layer piezoelectric flexure, and wherein at least a portion of the extended length flexure extends underneath an adjacent reflector plate to the first reflector plate.
2. The apparatus of claim 1, wherein the piezoelectric flexure, when actuated, allows displacement of the first reflector plate to alter the distance between the first reflector plate and the second reflector plate.
3. The apparatus of claim 1, wherein the extended length piezoelectric flexure is a dual active layer piezoelectric flexure and wherein the dual active layer piezoelectric flexure includes:
 a first electrode;
 a first piezoelectric layer above the first electrode;
 a second electrode above the first piezoelectric layer;
 a second piezoelectric layer above the second electrode; and
 a third electrode above the second piezoelectric layer.
4. The apparatus of claim 3, wherein the first electrode and the third electrode are biased with one polarity, and the second electrode is biased with a reversed polarity to produce a deflection of the dual active layer piezoelectric flexure.
5. The apparatus of claim 3, wherein the dual active layer piezoelectric flexure provides linearity of deflection of the piezoelectric flexure with respect to applied voltage.
6. The apparatus of claim 3, wherein the extended length piezoelectric flexure includes an L-shaped extended length piezoelectric flexure.
7. The apparatus of claim 6, wherein the L-shape of the extended length piezoelectric flexure is formed from a first arm and a second arm, wherein a cross sectional dimension of at least a portion of the second aim is reduced as compared to a cross sectional dimension of the first arm.
8. The apparatus of claim 7, wherein the L-shape of the extended length piezoelectric flexure is formed from a first arm and a second arm that are both configured to provide an improved flexibility for motion in the plane parallel to the reflector plate.
9. The apparatus of claim 1, wherein the extended length piezoelectric flexure includes a curved extended length piezoelectric flexure.
10. The apparatus of claim 1, wherein the extended length piezoelectric flexure is non-straight to allow the extended length piezoelectric flexure to be complaint in both axes of a plane parallel to the first reflector plate.
11. The apparatus of claim 1, wherein the extended length piezoelectric flexure includes a dropped extended length piezoelectric flexure.
12. The apparatus of claim 1, wherein the extended length piezoelectric flexure has a greater active length than a cross-sectional dimension of the light modulator element and the extended length piezoelectric flexure is contained within the lateral confines of the light modulator element.
13. The apparatus of claim 1, wherein the light modulator includes a Fabry-Perot device.
14. The apparatus of claim 1, wherein the light modulator includes an interference device.
15. An apparatus, comprising:
 a display, the display including a light modulator, the light modulator further including at least one dual active layer piezoelectric flexure, wherein the dual active layer piezoelectric flexure includes two piezoelectric layers that are configured to extend in opposed axial directions, and wherein the dual active layer piezoelectric flexure includes:

a first electrode;
a first piezoelectric layer above the first electrode;
a second electrode above the first piezoelectric layer;
a second piezoelectric layer above the second electrode; and
a third electrode above the second piezoelectric layer.

16. The apparatus of claim 15, wherein the first electrode and the third electrode are biased with one polarity, and the second electrode is biased with a reversed polarity to produce a deflection of the dual active layer piezoelectric flexure.

17. The apparatus of claim 15, wherein the dual active layer piezoelectric flexure provides linearity of deflection of the piezoelectric flexure with respect to applied voltage.

18. The apparatus of claim 15, wherein the piezoelectric flexure is an extended length piezoelectric flexure that includes an L-shaped extended length piezoelectric flexure.

19. The apparatus of claim 18, wherein the L-shape of the extended length piezoelectric flexure is formed from a first arm and a second arm, wherein a cross sectional dimension of at least a portion of the second arm is reduced as compared to a cross sectional dimension of the first arm.

20. The apparatus of claim 18, wherein the L-shape of the extended length piezoelectric flexure is formed from a first arm and a second arm that are both configured to provide an improved flexibility for improved motion in the plane parallel to the reflector plate.

21. The apparatus of claim 15, wherein the piezoelectric flexure is an extended length piezoelectric flexure that includes a curved extended length piezoelectric flexure.

22. The apparatus of claim 15, wherein the piezoelectric flexure is an extended length piezoelectric flexure that allows the extended length piezoelectric flexure to be complaint in both axes of a plane parallel to the first reflector plate.

23. The apparatus of claim 15, wherein the piezoelectric flexure is an extended length piezoelectric flexure, and wherein the extended length piezoelectric flexure includes a dropped extended length piezoelectric flexure.

24. The apparatus of claim 15, wherein the piezoelectric flexure is an extended length piezoelectric flexure, and wherein the extended length piezoelectric flexure has a greater active length than a cross-sectional dimension of the light modulator element and the extended length piezoelectric flexure is contained within the lateral confines of the light modulator element.

25. The apparatus of claim 15, wherein the piezoelectric flexure is an extended length piezoelectric flexure, and wherein at least a portion of the extended length flexure extends underneath an adjacent reflector plate to the first reflector plate.

* * * * *